United States Patent
Lin et al.

(10) Patent No.: US 10,942,459 B2
(45) Date of Patent: Mar. 9, 2021

(54) LITHOGRAPHY SYSTEM AND CLEANING METHOD THEREOF

(71) Applicant: Taiwan Semiconductor Manufacturing Co., Ltd., Hsinchu (TW)

(72) Inventors: Sheng-Ta Lin, Miaoli County (TW); Li-Jui Chen, Hsinchu (TW); Shang-Chieh Chien, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/805,857

(22) Filed: Mar. 2, 2020

(65) Prior Publication Data

US 2021/0033990 A1  Feb. 4, 2021

Related U.S. Application Data

(60) Provisional application No. 62/880,046, filed on Jul. 29, 2019.

(51) Int. Cl.
*G03F 7/20* (2006.01)
(52) U.S. Cl.
CPC ...... *G03F 7/70925* (2013.01); *G03F 7/70883* (2013.01)
(58) Field of Classification Search
CPC ............ G03F 7/70925; G03F 7/70033; G03F 7/70883; H05G 2/00
See application file for complete search history.

(56) References Cited

U.S. PATENT DOCUMENTS

| | | | |
|---|---|---|---|
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 2012/0104290 A1* | 5/2012 | Nishisaka | H05G 2/006 250/504 R |
| 2013/0032640 A1* | 2/2013 | Yabu | B05B 15/52 239/13 |

(Continued)

*Primary Examiner* — Steven Whitesell Gordon
(74) *Attorney, Agent, or Firm* — JCIPRNET

(57) ABSTRACT

A lithography system and a cleaning method thereof are provided. The lithography system includes a light source generator. The light source generator includes a collector, a droplet generator and a droplet catcher. The droplet generator and the droplet catcher are facing each other, and disposed at a region surrounding the collector. The cleaning method includes: shifting the droplet generator out of the light source generator via a port of the light source generator; inserting a shove assembly into the light source generator via the port; using a borescope attached to the shovel assembly to identify a location of a deposit formed by droplets generated by the droplet generator; using the shovel assembly to remove and collect the deposit; and withdrawing the shovel assembly along with the borescope from the light source generator via the port.

20 Claims, 7 Drawing Sheets

(56) References Cited

U.S. PATENT DOCUMENTS

| | | | |
|---|---|---|---|
| 2014/0008552 A1* | 1/2014 | Umeda | H05G 2/008 |
| | | | 250/504 R |
| 2016/0207078 A1* | 7/2016 | Becker | G03F 7/70925 |
| 2017/0059998 A1* | 3/2017 | Kim | G02B 19/0009 |
| 2019/0033225 A1* | 1/2019 | Chang | G03F 7/70166 |
| 2020/0146136 A1* | 5/2020 | Yu | G03F 7/70175 |

* cited by examiner

LITHOGRAPHY SYSTEM AND CLEANING METHOD THEREOF

CROSS-REFERENCE TO RELATED APPLICATION

This application claims the priority benefit of U.S. provisional application Ser. No. 62/880,046, filed on Jul. 29, 2019. The entirety of the above-mentioned patent application is hereby incorporated by reference herein and made a part of this specification.

BACKGROUND

In recent years, the semiconductor industry has experienced rapid growth due to continuous improvement in integration density of various electronic components. For the most part, this improvement in integration density has come from continuously reductions in minimum feature size of the integrated circuits (ICs), which allows more of smaller components to be integrated into a given area. Thus, production efficiency of the ICs is improved.

On the other hand, such scaling down has increased complexity in manufacturing process of the ICs. For example, the need to perform higher resolution lithography processes grows. In optical projection lithography systems, the resolution (i.e., the minimum feature size) is limited by diffraction of light. According to Rayleigh equation, the minimum feature size is proportional to wavelength of light source. Therefore, developing lithography system using light source of shorter wavelength is important for scaling of the ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3B is a schematic diagram illustrating insertion of a shovel assembly and a borescope into the main frame via one of the side ports during the cleaning process as shown in

FIG. 3A.

DETAILED DESCRIPTION

Figure 1:
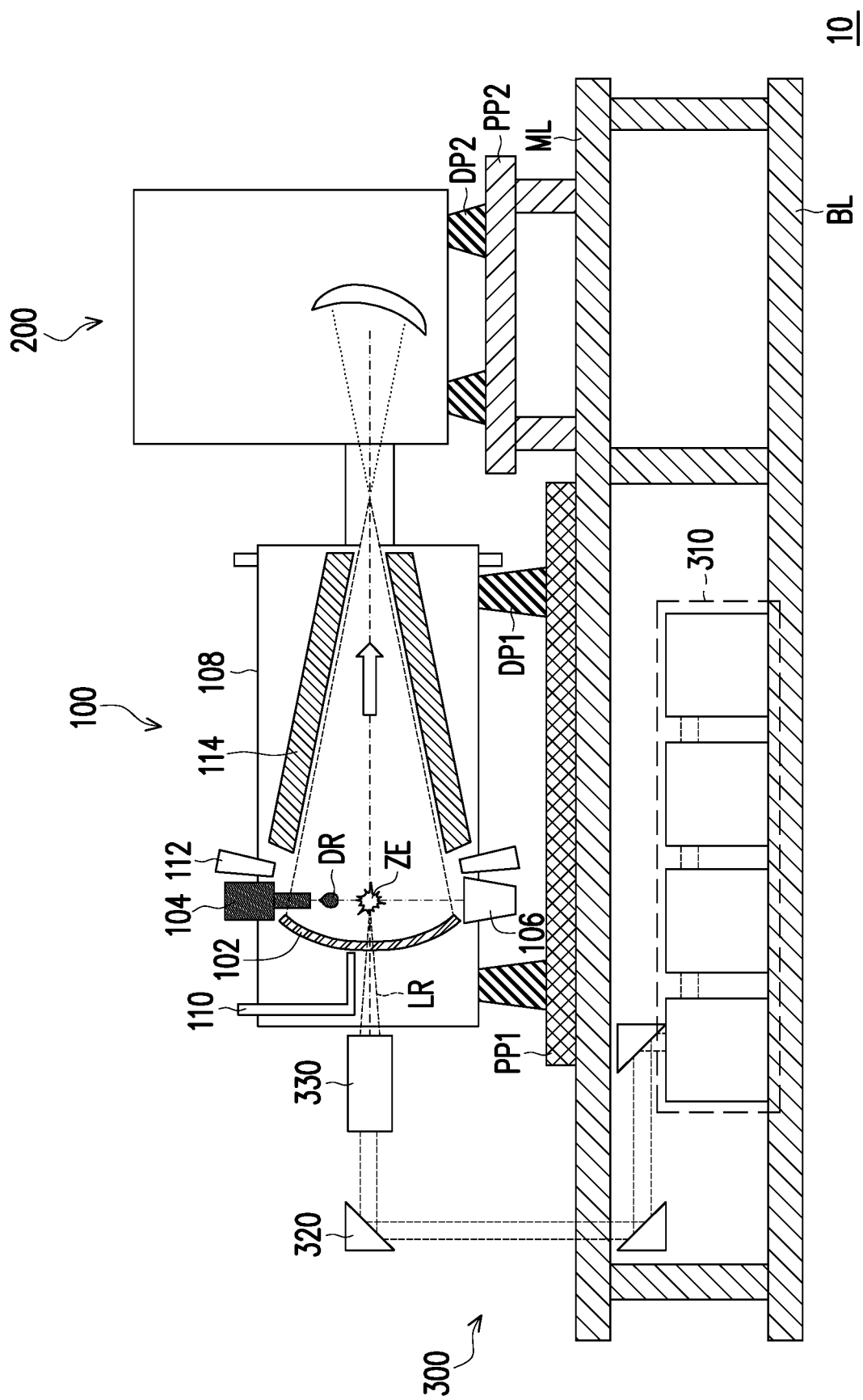
FIG. 1 is a schematic diagram illustrating a lithography system according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be appreciated that the following embodiment(s) of the present disclosure provides applicable concepts that can be embodied in a wide variety of specific contexts. The embodiments are intended to provide further explanations but are not used to limit the scope of the present disclosure.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1 is a schematic diagram illustrating a lithography system 10 according to some embodiments of the present disclosure.

Referring to FIG. 1, in some embodiments, the lithography system 10 is an extreme ultraviolet (EUV) lithography system, which uses light in EUV wavelength range. For instance, the EUV wavelength range is from about 1 nm to about 100 nm. In certain cases, the EUV light has an emission peak at a wavelength of about 13.5 nm. In some embodiments, the lithography system 10 includes a light source generator 100, an exposure tool 200 and an excitation laser generator 300. The EUV light is generated in the light source generator 100, and is directed to the exposure tool 200. The exposure tool 200, such as a scanner, directs the EUV light to a reticle (not shown) to form light patterns, and projects these light patterns to a workpiece (e.g., a semiconductor wafer) coated with a photosensitive layer (e.g., a photoresist). Accordingly, desired patterns are transferred to the workpiece from the reticle. In some embodiments, the light source generator 100 generates the EUV light by laser produced plasma (LPP). In these embodiments, the laser for producing the plasma is provided by the excitation laser generator 300. As shown in FIG. 1, in some embodiments, the light source generator 100 and the exposure tool 200 are installed on a main floor ML of a clean room, whereas the excitation laser generator 300 is installed in a base floor BL located under the main floor ML. In addition, the light source generator 100 and the exposure tool 200 may be placed on pedestal plates PP1 and PP2 via dampers DP1 and DP2, respectively.

In some embodiments, the light source generator 100 includes a collector 102, a droplet generator 104 and a droplet catcher 106. The collector 102, the droplet generator 104 and the droplet catcher 106 may be enclosed by a vacuum chamber 108. In some embodiments, excitation laser LR generated by the excitation laser generator 300 passes through a window (e.g., an opening) of the collector 102 and hits droplets DR produced by the droplet generator 104, such that a material of the droplets DR is ionized, and plasma is formed at an excitation zone ZE in the vicinity of the intersection of the excitation laser LR and the droplets DR. In some embodiments, the droplets DR are tin (Sn) droplets. In alternative embodiments, other tin containing material, such as a eutectic alloy containing tin (Sn) and lithium (Li), may be used for the droplets DR. In addition, in some embodiments, the excitation laser LR is provided as laser pulses (e.g., $CO_2$ laser pulses), and includes a pre-pulse laser and a main pulse laser. The pre-pulse laser hits the droplets DR and transforms the droplets DR into fine mist, then the fine mist is hit by the main pulse laser, and a material of the droplets DR (i.e., a material of the fine mist) is ionized to form the plasma. The plasma emits the EUV light, and the EUV light is reflected and focused by the collector 102. In some embodiments, the collector 102 is an ellipsoidal reflector. In these embodiments, the excitation zone ZE may be located at one focus of the ellipsoidal reflector that is relatively close to the ellipsoidal reflector, whereas the EUV light is focused at another focus of the ellipsoidal reflector that is relatively away from the ellipsoidal reflector. The focused EUV light can be functioned as a light source of the exposure tool 200 coupled to the light source generator 100. On the other hand, excessive droplets DR are caught by the droplet catcher 106. In some embodiments, the droplet generator 104 and the droplet catcher 106 are disposed in a region surrounding the collector 102, and configured to be facing each other. Moreover, the droplet catcher 106 may be heated to a temperature higher than a melting point of the material of the droplets DR, such that the excessive droplets DR can be collected as liquid. For instance, the droplets DR are tin droplets, and the droplet catcher 106 may be heated to about 250° C. to about 300° C. (e.g., 280° C.).

In some embodiments, the collector 102 is a Bragg reflector, and may be formed in an ellipsoidal shape having a concave side (i.e., the reflective side) and a convex side (i.e., the back side). In these embodiments, although not shown, the collector 102 includes a stack of reflective layers coated over a concave surface of a substrate. The stack of reflective layers includes a plurality of film pairs respectively having a first reflective layer (e.g. Mo layer) and a second reflective layer (e.g., Si layer or Be layer). The first reflective layers and the second reflective layers are alternately formed over the substrate. For instance, the stack of reflective layers may include 50 or more of the film pairs. In some embodiments, the Bragg reflector further includes a capping layer (not shown), such as Ru layer, formed over the stack of reflective layers. In addition, in some embodiments, the collector 102 further includes a grating structure (not shown). The grating structure (e.g., silicon nitride grating pattern) is formed over the Bragg reflector. During the process for producing the EUV light, ions or atoms of the droplets DR may be deposited or bombarded on the collector 102 as well as other parts in the vacuum chamber 108. As a result, a reflectivity of the collector 102 may decrease, and an intensity of the reflected EUV light may be reduced. In order to prevent such undesired deposition or bombardment on the collector 102, one or more mechanisms can be adopted. In some embodiments, buffer gas is provided to the reflective side of the collector 102 (e.g., the concave side of the collector 102). The buffer gas may react with atoms of the droplets DR to be deposited on the collector 102, and form gaseous products that could be pumped out of the vacuum chamber 108. For instance, when the droplets DR are tin droplets, the buffer gas may include hydrogen gas, and the hydrogen containing buffer gas may react with the tin droplets to form the gaseous product of tin hydride ($SnH_4$). In some embodiments, the buffer gas is provided by gas supply apparatuses 110 and 112. The gas supply apparatus 110 is disposed at a back side of the collector 102, and the supplied buffer gas may pass through the collector 102 to the reflective side of the collector 102. For instance, the buffer gas supplied by the gas supply apparatus 110 and the excitation laser LR may pass through the same window (e.g. opening) located in a central region of the collector 102. On the other hand, the gas supply apparatuses 112 are disposed at the reflective side of the collector 102, and the buffer gas may be supplied to the vicinity of the excitation zone ZE, so as to prevent atoms of the droplets DR from depositing on the collector 102 and other parts at the reflective side of the collector 102 in the vacuum chamber 108. In some embodiments, the light source generator 100 further includes at least one magnetic coil (not shown) disposed in the region surrounding the collector 102. The magnetic coil(s) is configured to produce a magnetic field in the vicinity of the excitation zone ZE. The magnetic field can confine the ions of the droplets DR emitting from the plasma, so as to prevent these ions from hitting the collector 102 and other pars at the reflective side of the collector 102 in the vacuum chamber 108.

In some embodiments, the light source generator 100 further includes a debris collection mechanism 114. The debris collection mechanism 114 has a central passage penetrating through the debris collection mechanism 114 along an extending direction of the debris collection mechanism 114, and includes a plurality of vanes (not shown) running obliquely around the central passage. The reflected EUV light passes through the central passage of the debris collection mechanism, then leaves the light source generator 100. The vanes are configured to sweep out debris, such as atoms of the droplets DR (e.g., tin atoms), the gaseous products of the droplets DR and the buffer gas or a combination thereof, from the central passage. The vanes may be heated, such that the debris may solidly attach to surfaces of the vanes, and melt and form droplets running along and between the vanes, so as to be collected. In some embodiments, a width of the central passage may decrease along the extending direction away from the collector 102, and the debris collection mechanism 114 may have a frustoconical shape.

The reflected and focused EUV light enters the exposure tool 200 after leaving the light source generator 100. In some embodiments, although not shown, the exposure tool 200 includes a plurality of reflective optic components, a reticle holding mechanism and a workpiece holding mechanism. The EUV light came from the light source generator 100 is guided by some of the reflective optical components onto a reticle secured on the reticle holding mechanism (e.g., a vacuum chuck or an electrostatic chuck (e-chuck)). In some embodiments, the reticle is a reflective reticle, and the EUV light patterns are formed when the incident EUV light is partially reflected by the reflective reticle. Subsequently, these EUV light patterns are projected onto a workpiece (e.g., a semiconductor wafer) hold by the workpiece holding mechanism (e.g., a vacuum chuck or an e-chuck) via others of the reflective optic components. The workpiece is coated with a photosensitive material. After being exposed to the projected EUV light patterns and subjected to a development process, the photosensitive material is patterned. As performing an etching process by using the photosensitive material as a mask, the pattern of the photosensitive material can be transferred to the workpiece. In some embodiments, the reflective reticle includes a Bragg reflector and an absorption pattern formed over the Bragg reflector. The stack of reflective layers may include a plurality of film pairs respectively including a first reflective layer (e.g., Mo layer) and a second reflective layer (e.g., Si layer or Be layer). The first reflective layers and the second reflective layers are alternately formed over a substrate. For instance, the Bragg reflector includes 50 or more of the film pairs. In some embodiments, the Bragg reflector further includes a capping layer (e.g., Ru layer) covering the stack of reflective layer for protecting the stack of reflective layers. The absorption pattern, such as a tantalum boron nitride (TaBN) pattern, tantalum nitride (TaN) or the like, defines the EUV light pattern to be projected onto the workpiece. Some portions of the incident EUV light are absorbed by the absorption pattern, whereas other portions of the incident EUV light are reflected by the Braff reflector, so as to form the light patterns. In those embodiments where the Bragg reflector includes the capping layer, and the absorption pattern is formed over the capping layer.

In some embodiments, the excitation laser generator 300 configured to generate the excitation laser LR includes a laser generation system 310, laser guide optics 320 and a focusing apparatus 330. Laser pulses (including the main pulse laser and the pre-pulse laser) are generated by the laser generation system 310, and delivered and focused via the laser guide optics 320 and the focusing apparatus 330, respectively. In some embodiments, the laser generation system 310 includes one or more laser source discharged devices and/or lamps (both not shown) for providing the laser pulses with direct current (DC) or radio frequency (RF) excitation. For instance, the laser source may be carbon dioxide ($CO_2$) or neodymium-doped yttrium aluminum garnet (Nd:YAG), and a wavelength range of the produced laser pulses may be from about 9100 nm to about 11000 nm (e.g., at about 10600 nm). In addition, the laser generation system 310 may have one or more power amplifiers for boosting an output power. The produced laser pulses are guided, shaped and focused through the laser guide optics 320 and the focusing apparatus 330, and form the excitation laser LR for generating the plasma by hitting the droplets DR in the light source generator 100.

Figure 2:
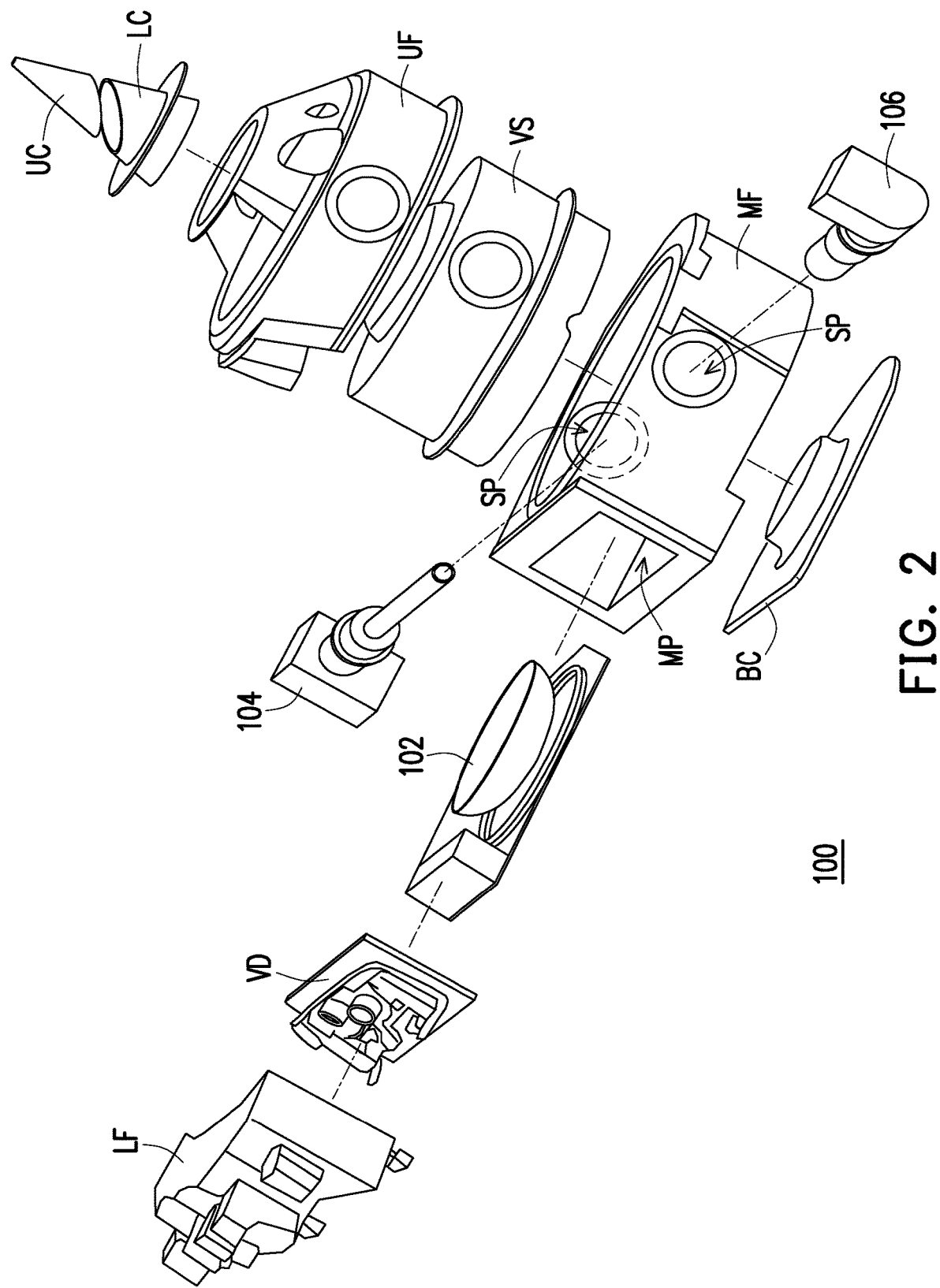
FIG. 2 is an explosive view of the light source generator according to some embodiments of the present disclosure.

FIG. 2 is an explosive view of the light source generator 100 according to some embodiments of the present disclosure.

Referring to FIG. 1 and FIG. 2, in some embodiments, the collector 102, the droplet generator 104 and the droplet catcher 106 are installed in a main frame MF. The main frame MF can be regarded as a part of the vacuum chamber 108 shown in FIG. 1. In addition, the vacuum chamber 108 may further include a vessel VS, a lower cone LC and an upper cone UC. The vessel VS is connected to the main frame MF around an opening of the main frame MF, and located at the reflective side (e.g., the concave side) of the collector 102. The debris collection mechanism 114 as shown in FIG. 1 is surrounded by the vessel VS. The lower cone LC and the upper cone UC are collectively referred as an exit cone, which is connected between the vessel VS and an intermediate focus where the EUV light reflected by the collector 102 is focused. The EUV light reflected by the collector 102 sequentially passes through the main frame MF, the vessel VS, the lower cone LC and the upper cone UC, and then focuses at the intermediate focus just outside the upper cone UC. Thereafter, the EUV light enters the exposure tool 200 as shown in FIG. 1. In some embodiments, the vacuum chamber 108 further includes an upper metrology frame UF and a bottom cover BC. The metrology frame UF covers a sidewall of the vessel VS. Water pipe(s) and/or gas pipe(s) may extend into the vacuum chamber 108 through the metrology frame UF, and pressure gauge(s) and/or temperature sensor(s) may be disposed on the metrology frame UF. The bottom cover BC covers a bottom side of the main frame MF, and located at the back side (e.g., the convex side) of the collector 102. The excitation laser LR as shown in FIG. 1 may pass through a window of the bottom cover BC and a window of the collector 102, then arrive the reflective side (e.g., the concave side) of the collector 102.

Referring to FIG. 2, in some embodiments, the main frame MF has a main port MP and two side ports SP. The main port MP is located between the side ports SP. The collector 102 can be installed into or moved out from the main frame MF via the main port MP. In some embodiments, a vacuum door VD is configured to seal the main port MP. In addition, a lower metrology frame LF may be secured to the vacuum door VD from, for example, outside the main frame MF. One or more detection device(s) may be installed on the lower metrology frame LF, and may extend into the main frame MF through the vacuum door VD. For instance, the detection device(s) may include camera(s) (e.g., including a fine droplet steering camera (FDSC), a coarse droplet steering camera (CDSC), a droplet formation camera (DFC), the like or combinations thereof), a backlight laser module (BLM), a droplet illumination module (DIM), a droplet detect module (DDM), the like or combinations thereof. On the other hand, the droplet generator 104 and the droplet catcher 106 can be inserted into the main frame MF via the two side ports SP, respectively. During the process for producing the EUV light, some of the droplets DR (as shown in FIG. 1) may accidently deposit on portions of the vacuum chamber 108 around the droplet catcher after 106 passing through the excitation zone ZE, rather than being collected by the droplet catcher 106. The subsequently emitted droplets DR may hit the deposits, and rebound to the collector 102. As a result, a reflectivity of the collector 102 is compromised, and a method for cleaning the deposits is required.

Figure 3A:
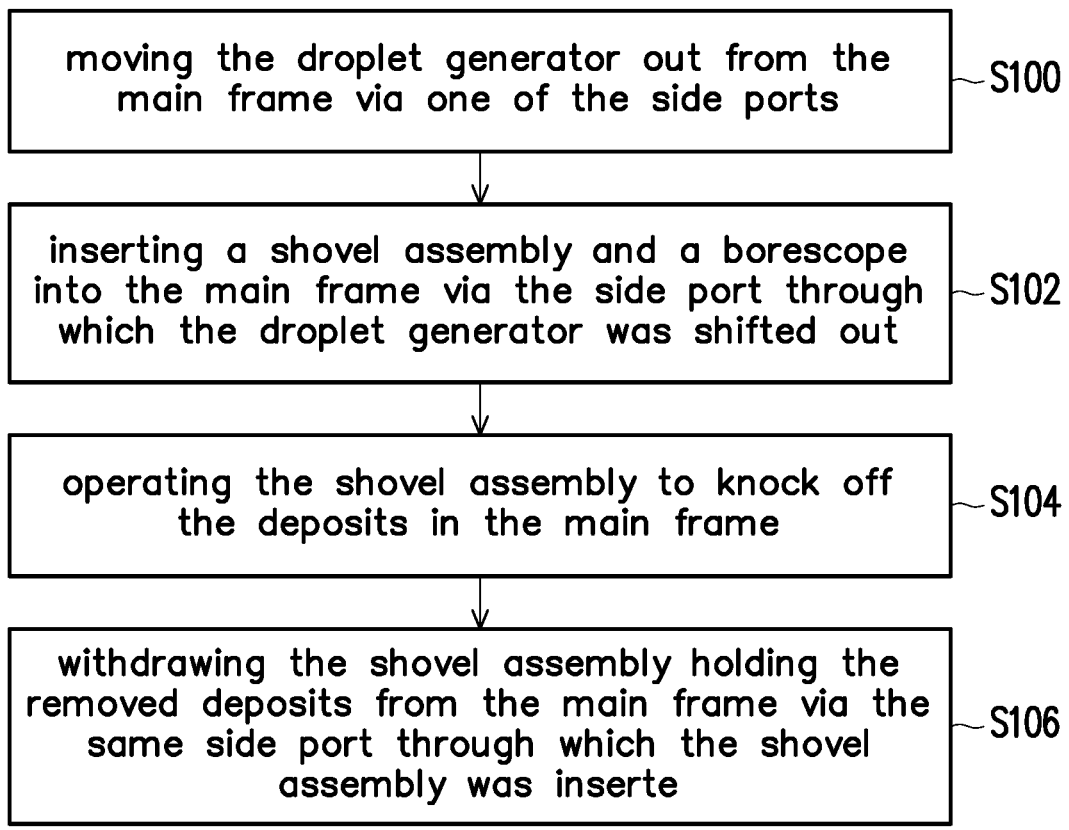
FIG. 3A is a process flow diagram illustrating a cleaning method of a lithography system according to some embodiments of the present disclosure.
Figure 3B:
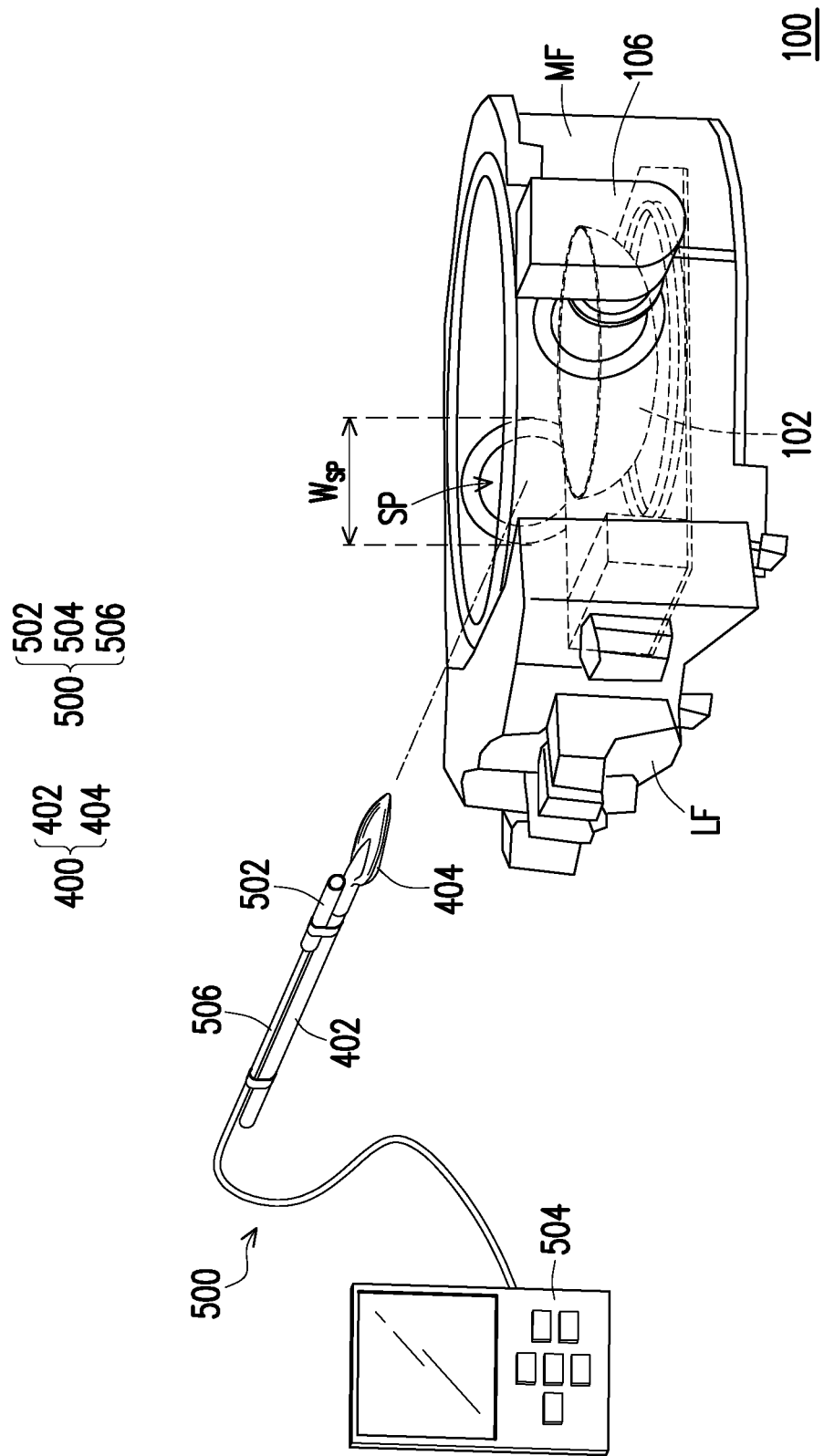
Figure 3C:
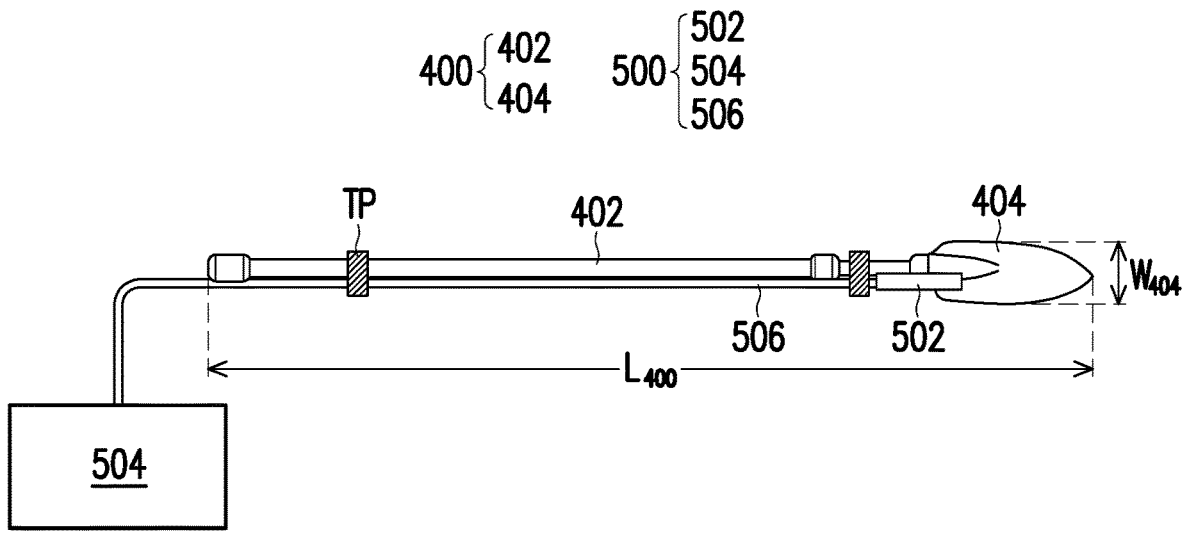
FIG. 3C is an enlarged view illustrating the shovel assembly and the borescope shown in FIG. 3B.

FIG. 3A is a process flow diagram illustrating a cleaning method of the light source generator 100 according to some embodiments of the present disclosure. FIG. 3B is a schematic diagram illustrating insertion of a shovel assembly 400 and a borescope 500 into the main frame MF via one of the side ports SP during the cleaning process as shown in FIG. 3A. FIG. 3C is an enlarged view illustrating the shovel assembly 400 and the borescope 500 shown in FIG. 3B. The cleaning method for the light source generator 100 includes the following steps.

Referring to FIG. 2, FIG. 3A and FIG. 3B, step S100 is performed, and the droplet generator 104 is moved out from the main frame MF via one of the side ports SP. Shifting the droplet generator 104 out of the main frame MF may be performed when a pressure inside the main frame MF and a pressure outside the main frame MF are balanced. After shifting the droplet generator 104 from the main frame MF, the collector 102 and the droplet catcher 106 may remain in the main frame MF. In addition, after shifting the droplet generator 104 from the main frame MF, a cavity in the main frame MF can be communicated externally via the side port SP through which the droplet generator 104 is shifted out.

Referring to FIG. 3A, FIG. 3B, step S102 is performed, and a shovel assembly 400 and a borescope 500 are inserted into the main frame MF via the side port SP through which the droplet generator 104 was shifted out. The shovel assembly 400 is configured to knock off and collect the deposits. The borescope 500 is attached to the shovel assembly 400, and configured to identify location(s) of the deposits in the main frame MF and/or the vessel VS (as shown in FIG. 2), and to monitor the removal of the deposits performed by using the shovel assembly 400. In general, the deposits are located around the entry of the vessel VS (as shown in FIG. 2) connected to the main frame MF from above, and adjacent to the droplet catcher 106. For instance, the deposits are located at a bottom surface of the vessel VS and/or a top portion of the main frame MF that is/are adjacent to the droplet catcher 106. However, other location(s) of the deposits could be removed by using the shovel assembly 400 and the borescope 500, the present disclosure is not limited to removing the deposits at certain locations. In some embodiments, the shovel assembly 400 and the borescope 500 are manually inserted into the main frame MF. In alternative embodiments, the shovel assembly 400 and the borescope 500 attached to the shovel assembly 400 are handled by a robotic arm (not shown). In these alternative embodiments, the shovel assembly 400 and the borescope 500 are inserted into the main frame MF by the robotic arm.

Referring to FIG. 3B and FIG. 3C, in some embodiments, the shovel assembly 400 includes a handle bar 402 and a shovel 404 connected to the handle bar 402. The handle bar 402 is configured to be handled manually, or handled by a robotic arm. A far end of the handle bar 402 is connected to the shovel 404, whereas a near end of the handle bar 402 is hold by an operator or the robotic arm. In some embodiments, the handle bar 402 is extendable, and can be extended or shortened according to the locations of the deposits, which may be identified by the borescope 500. The shovel 404 is configured to hit the deposits for knocking off the deposits, and to hold the deposits that are no longer attached to the main frame MF and/or the vessel VS (as shown in FIG. 2). In some embodiments, the shovel 404 is made of a rigid material, such as metal (e.g., steel). Moreover, in some embodiments, the shovel 404 is coated with an adhesive layer (not shown). The adhesive layer, such as a glue layer, is configured to adhere the deposits that are knocked off from the main frame MF and/or the vessel VS. In these embodiments, the removed deposits can be better collected on the shovel 404, and are less likely to remain in the light source generator 100 as contaminations after the cleaning process is completed. Regarding dimensions of the shovel assembly 400, a width $W_{404}$ of the shovel 404 is less than a width $W_{sp}$ of the side port SP through which the shovel assembly 400 is inserted. In addition, the shovel assembly 400 shall be long enough to reach the side port SP through which the droplet catcher 106 is inserted, such that the deposits located around the droplet catcher 106 can be removed by the shovel assembly 400. For instance, a width $W_{404}$ may range from 5 cm to 10 cm (e.g., 6 cm), whereas a total length $L_{400}$ of the shovel assembly 400 may range from 125 cm to 215 cm.

The borescope 500 attached to the handle bar 402 may include an inspection device 502, a display apparatus 504 and a wire 506 connected between the inspection device 502 and the display apparatus 504. The inspection device 502 and the wire 506 are attached to the shovel assembly 400 (e.g., the handle bar 402 of the shovel assembly 400) by, for example, one or more tapes TP, and are moved along with the shovel assembly 400. In some embodiments, the inspection device 502 is fixed to the handle bar 402 near the far end of the handle bar 402 (to which the shovel 404 is connected). On the other hand, the display apparatus 504 may stay outside the main frame MF even when the shovel assembly 400, the inspection device 502 and a portion of the wire 506 are inserted into the main frame MF. The inspection device 502, such as a camera, is configured to capture still images or video images from inside the main frame MF and/or the vessel VS, and the wire 506 (e.g., optical fiber) is configured to transmit the images captured by the inspection device 502 to the display apparatus 504. The display apparatus 504 staying outside the main frame MF is configured to display these captured images. According to the images shown on the display apparatus 504, the location(s) of the deposits can be identified, and the removal of the deposits can be monitored. In some embodiments, the inspection device 502 is equipped with an illumination device (not shown), which is configured to illuminate observation targets of the inspection device 502.

Referring to FIG. 3A and FIG. 3B, step S104 is performed, and the shovel assembly 400 is operated to knock off the deposits in the main frame MF and/or the vessel VS (as shown in FIG. 2). During the removal of the deposits, the shovel 404 of the shovel assembly 400 is operated to knock off the deposits from the main frame MF and/or the vessel VS (as shown in FIG. 2), and to collected the removed deposits. In some embodiments, the borescope 500 can monitor the removal process, and an operator may adjust the movement of the shovel assembly 400 according to the image provided by the borescope 500.

Thereafter, step S106 is performed, and the shovel assembly 400 holding the removed deposits is withdrawn from the main frame MF via the same side port SP through which the shovel assembly 400 was inserted. Along with the withdrawal of the shovel assembly 400, the borescope 500 attached to the shovel assembly 400 is withdrawn from the main frame MF as well. Subsequently, the deposits hold by the shove assembly 400 are took off from the shovel assembly 400. Up to here, a cleaning cycle for removing the deposits in the main frame MF and/or the vessel VS (as shown in FIG. 2) is completed. The cleaning cycle includes the step S102, the step S104 and the step S106. In some embodiments, more than one of the cleaning cycles may be performed for further cleaning the main frame MF and/or the vessel VS. Moreover, after performing one or more of the cleaning cycle(s), the droplet generator 104 (as shown in FIG. 2) is installed back into the main frame MF via the same side port SP through which the shovel assembly 400 was inserted and withdrawn.

In summary, the cleaning method for removing the undesired deposits in the light source generator 100 according to some embodiments of the present disclosure includes: moving the droplet generator 104 from the main frame MF of the light source generator 100 via one of the side ports SP of the main frame MF; inserting the shovel assembly 400 into the main frame MF through the same side port SP; using the shovel assembly 400 to knock off and collect the deposits; and withdrawing the shovel assembly 400 from the main frame MF. In this way, the cleaning method can be performed without shifting out the collector 102 from the main frame MF via the main port MP. Regarding the complexity of the components installed around the main port MP, shifting the collector 102 from/into the main frame MF via the main port MP is very time-consuming. For instance, shifting the collector 102 from and into the main frame MF via the main port MP may take at least three workdays. Therefore, as a result of avoiding from shifting out the collector 102 via the main port MP, time required for performing the cleaning method according to some embodiments of the present disclosure can be significantly reduced. For instance, the cleaning method according to some embodiments of the present disclosure may be completed in less than 12 hours. Furthermore, in some embodiment, the cleaning method according to some embodiments of the present disclosure is assisted by using the borescope 150 to identify the location(s) of the deposits, and to monitor the removal process of the deposits.

Figure 4:
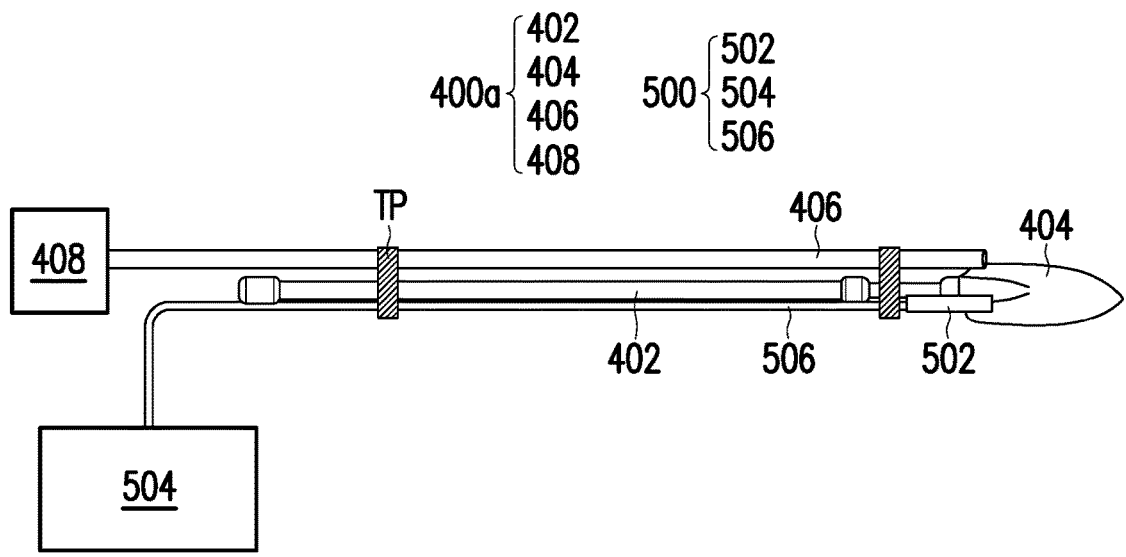
FIG. 4 through FIG. 6 are schematic diagrams illustrating shovel assemblies and borescope according to some embodiments of the present disclosure.

FIG. 4 is a schematic diagram illustrating a shovel assembly 400a and the borescope 500 according to some embodiments of the present disclosure. The shovel assembly 400a shown in FIG. 4 is similar to the shovel assembly 400 as shown in FIG. 3C. Difference therebetween will be discussed, whereas the same or the like parts will not be repeated again.

Referring to FIG. 3C and FIG. 4, the difference between the shovel assembly 400a as shown in FIG. 4 and the shovel assembly 400 as shown in FIG. 3C lies in that the shovel assembly 400a as shown in FIG. 4 further includes a suction tube 406 and a pump 408. At least a portion of the suction tube 406 is attached to the handle bar 402, and is configured to move along with the handle bar 402, the shovel 404 and a portion of the borescope 500. On the other hand, the pump 408 may stay outside the main frame MF even when the suction tube 406 is inserted into the main frame MF. A near end of the suction tube 406 is connected to the pump 408, whereas a far end of the suction tube 406 may reach the shovel 404. The pump 408 is configured to pump out the removed deposits through the suction tube 406. In this way, the removed deposits can be immediately pumped out from the main frame MF during the cleaning process. Therefore, a possibility of leaving the removed deposits in the main frame MF and/or the vessel VS can be further lowered.

Figure 5:
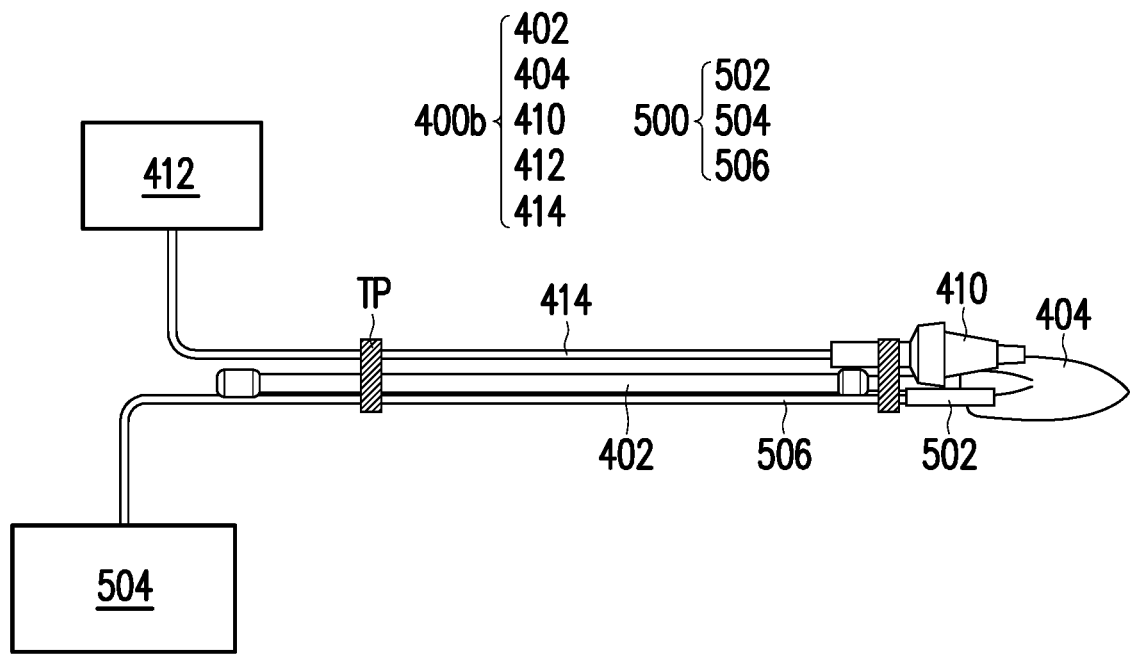

FIG. 5 is a schematic diagram illustrating a shovel assembly 400b and the borescope 500 according to some embodiments of the present disclosure. The shovel assembly 400b shown in FIG. 5 is similar to the shovel assembly 400 as shown in FIG. 3C. Difference therebetween will be discussed, whereas the same or the like parts will not be repeated again.

Referring to FIG. 3C and FIG. 5, the difference between the shovel assembly 400b as shown in FIG. 5 and the shovel assembly 400 as shown in FIG. 3C lies in that the shovel assembly 400b as shown in FIG. 5 further includes a heating device 410, a power supply 412 and a wire 414 connected between the heating device 410 and the power supply 412. The heating device 410 and at least a portion of the wire 414 are attached to the handle bar 402, and configured to move along with the handle bar 402, the shovel 404 and a portion of the borescope 150. On the other hand, the power supply 412 may stay outside the main frame MF even when the heating device 410 and a portion of the wire 414 are inserted into the main frame MF. The heating device 410, such as a heating gun, is configured to melt or soften the deposits, whereas the power supply 412 is configured to provide power (e.g., electrical power) to the heating device 410 through the wire 414. Since the deposits are melted or softened, the deposits are more easily to be removed from the main frame MF and/or the vessel VS (as shown in FIG. 2) by the shovel 404. In some embodiments, the heating device 410 is attached to the handle bar 402 near the far end of the handle bar 402 to which the shovel 404 is connected. In these embodiment, the heating device 410 can be closer to the heating targets (i.e., the deposits), and a heating efficiency can be improved.

Figure 6:
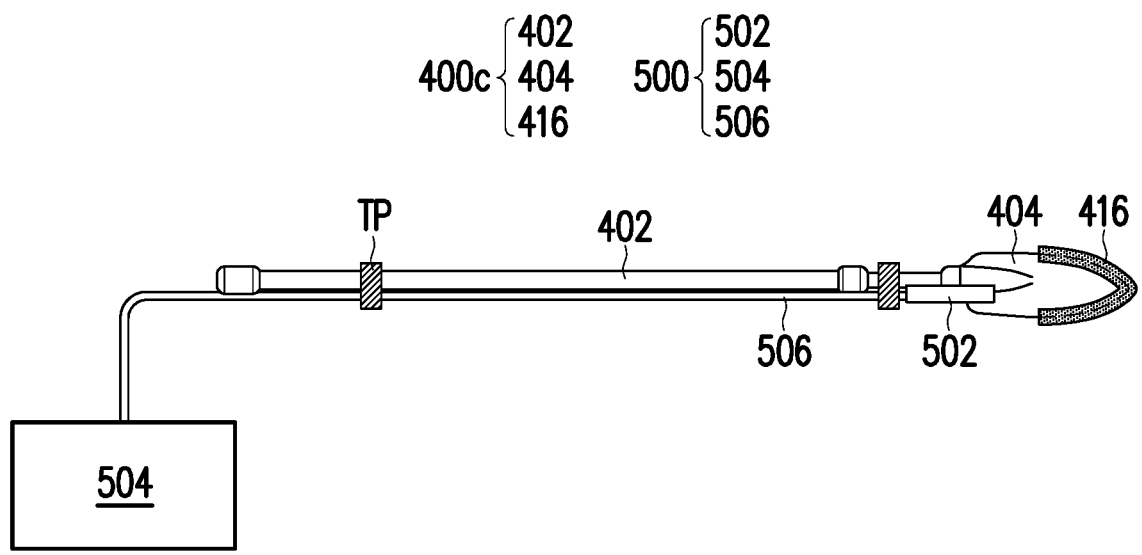

FIG. 6 is a schematic diagram illustrating a shovel assembly 400c and the borescope 500 according to some embodiments of the present disclosure. The shovel assembly 400c shown in FIG. 6 is similar to the shovel assembly 400 as shown in FIG. 3C. Difference therebetween will be discussed, whereas the same or the like parts will not be repeated again.

Referring to FIG. 3C and FIG. 6, the difference between the shovel assembly 400c as shown in FIG. 6 and the shovel assembly 400 as shown in FIG. 3C lies in that the shovel assembly 400c as shown in FIG. 6 further includes an elastic cover layer 416. The elastic cover layer 416 covers an edge portion of the shovel 404, in order to prevent the shovel 404 from damaging the main frame MF and/or the vessel VS (as shown in FIG. 2) during the removal of the deposits. In some embodiments, the elastic cover layer 416 may be a dust-free wiper or a dust-free tape.

Figure 7:
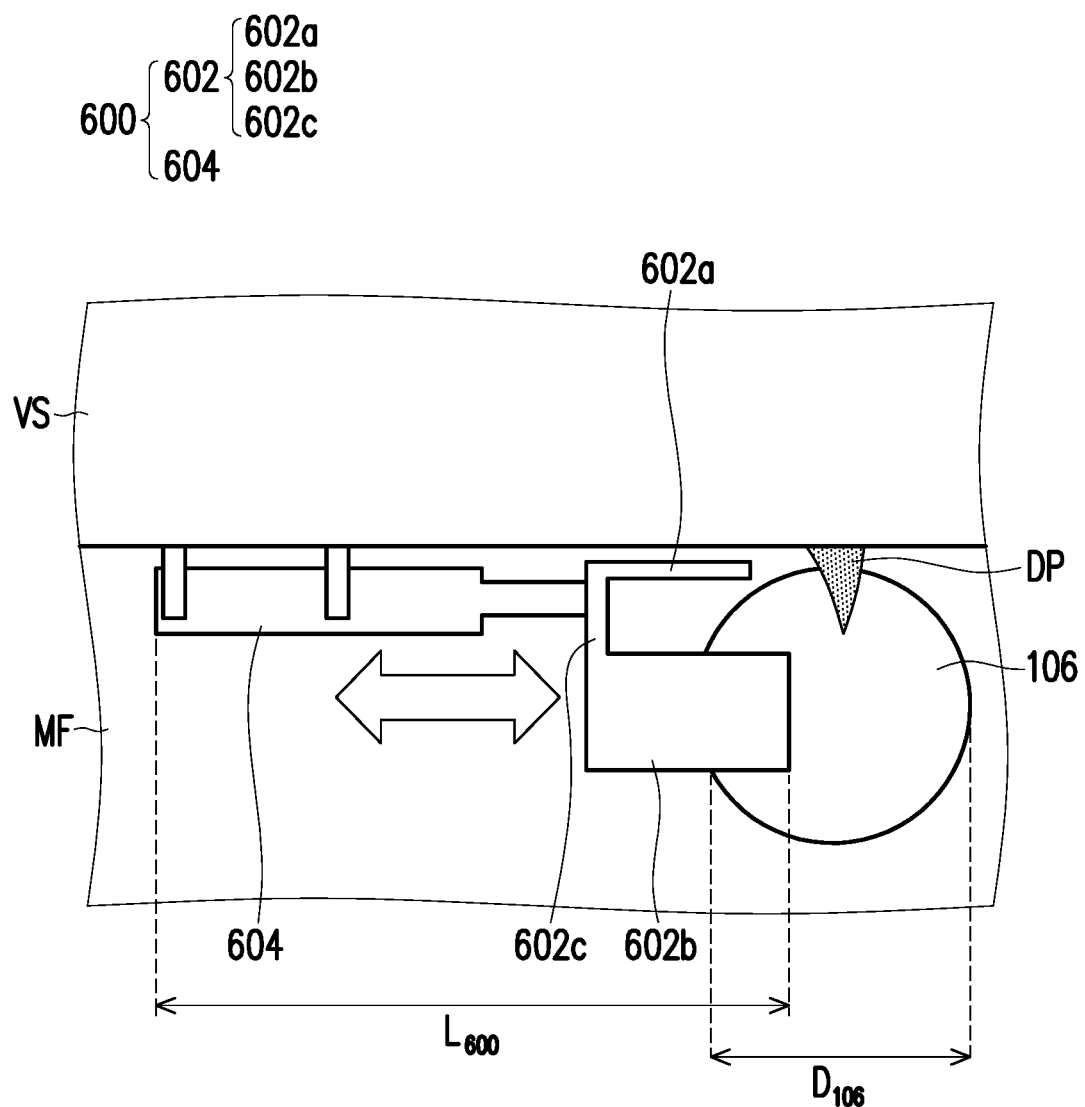
FIG. 7 is a schematic cross-sectional view illustrating a built-in cleaning apparatus in a light source generator according to some embodiments of the present disclosure.

FIG. 7 is a schematic cross-sectional view illustrating a built-in cleaning apparatus 600 in the light source generator 100 (as shown in FIG. 2) according to some embodiments of the present disclosure. It should be noted that, only a portion of the light source generator 100 in the vicinity of the entry of the vessel VS is schematically depicted in FIG. 7, whereas other components in the light source generator 100 are omitted.

Referring to FIG. 2 and FIG. 7, in some embodiments, the light source generator 100 further includes a built-in cleaning apparatus 600. The built-in cleaning apparatus 600 is configured to knock off the undesired deposits as described above (e.g., the deposits DP as shown in FIG. 7) without shifting any one of the collector 102, the droplet generator 104 and the droplet catcher 106 out of the main frame MF. In other words, the built-in cleaning apparatus 600 can be regarded as an in-line type cleaning apparatus that can be operated without breaking the vacuum condition of the light source generator 100. A location of the built-in cleaning apparatus 600 is close to where the undesired deposits (e.g., the deposits DP) prone to appear. In some embodiments, a detection device (not shown) inserted into the main frame MF is configured to monitor the formation of the deposits (e.g., the deposits DP). In these embodiments, the location of the built-in cleaning apparatus 600 can be determined according to the captured images of the detection device. For instance, the detection device may include a camera, and the camera may be inserted into the main frame MF through the main port MP covered by the vacuum door VD and the lower metrology frame LF. In alternative embodiments, the location of the built-in cleaning apparatus 600 can be determined by observing the locations of the deposits (e.g., the deposits DP) during maintenance of the light source generator 100. During the maintenance of the light source generator 100, the lower metrology frame LF and the vacuum door VD may be detached from the main frame MF, and the collector 102 may be shifted out from the main frame MF through the main port MP. As such, the main frame MF and/or the vessel VS can be observed (e.g., through the main port MP), and the location where the deposits (e.g., the deposits DP) are prone to form can be determined. For instance, as exemplarily shown in FIG. 7, the deposits DP are prone to form at a bottom surface of the vessel VS in the vicinity of the droplet catcher 106. Correspondingly, the built-in cleaning apparatus 600 may be attached to the bottom surface of the vessel VS, and located adjacent to the droplet catcher 106.

Referring to FIG. 7, in some embodiments, the built-in cleaning apparatus 600 includes a deposit remover 602 and an actuator 604. The actuator 604 is, for example, attached to the bottom surface of the vessel VS, and laterally connected to the deposit remover 602. The actuator 604 is driven to control the movement of the deposit remover 602 for knocking off the deposits DP. In other words, the deposit remover 602 and the shovel assembly 400 as shown in FIG. 3B have a similar function, except that the deposit remover 602 is fixed inside the main frame MF, whereas the shovel assembly 400 as show in FIG. 3B is inserted into the main frame MF only when a cleaning process is required. Moreover, the actuator 604 resembles the operator or the robotic arm as described with reference to FIG. 3B, since the actuator 604 and the operator/robotic arm both provide a force to push another component (i.e., the shovel assembly 400 as shown in FIG. 3B and the deposit remover 602 as shown in FIG. 7) for knocking off the deposits. Regarding the location of the built-in cleaning apparatus 600, the built-in cleaning apparatus 600 may have a size much smaller than the size of the shovel assembly 400 as shown in FIG. 3B, and the size of the built-in cleaning apparatus 600 may be comparable to a diameter D106 of the droplet catcher 106. For instance, a ratio of a total length $L_{600}$ of the built-in cleaning apparatus 600 with respect to the diameter D106 of the droplet catcher 106 may range from 1 to 2, and the diameter D106 may range from 5 cm to 10 cm. In some embodiments, the actuator 604 is a pneumatic actuator, and configured to push forward and pull back the deposit remover 602, such that the deposits DP can be hit and knocked off by the deposit remover 602. In some embodiments, the deposit remover 602 includes a hitting portion 602a, a container 602b and a connecting portion 602c connected between the hitting portion 602a and the container 602b. The hitting portion 602 is configured to hit the deposits DP. In some embodiments, the hitting portion 602 extends along the push/pull direction of the actuator 604, and may have a stick-like appearance. In addition, the hitting portion 602 may have a sharp end (not shown) toward the deposits DP, which can facilitate knocking off the deposits DP. The container 602b is disposed below the hitting portion 602a, and configured to collect the deposits DP being knocked off by the hitting portion 602a. In some embodiment, the collected deposits may be removed during maintenance of the light source generator 100. Moreover, in some embodiment, the connecting portion 602c connecting between the hitting portion 602a and the container 602b extends along a vertical direction, and may in contact with the actuator 604.

Although only a single built-in cleaning apparatus 600 is depicted in FIG. 7, those skilled in the art may dispose more than one of the built-in cleaning apparatuses 600 according to the locations of the deposits, the present disclosure is not limited to an amount of the built-in cleaning apparatus 600.

As above, the cleaning method of the lithography system according to some embodiments of the present disclosure includes removing the undesired deposits in the light source generator without shifting the collector out of the light source generator. As a result of avoiding from shifting the collector, time required for performing the cleaning method can be significantly reduced, and an efficiency of the cleaning method can be greatly improved. In some embodiments, the cleaning method can be realized by inserting the shovel assembly into the main frame of the light source generator via one of the side ports, and removing the deposits by using the shovel assembly. In alternative embodiments, the cleaning method is realized by driving the built-in cleaning apparatus disposed in the light source generator, to remove the deposits.

In an aspect of the present disclosure, a cleaning method of a lithography system is provided. The lithography system comprises a light source generator. The light source generator comprises a collector, a droplet generator and a droplet catcher. The droplet generator and the droplet catcher are facing each other, and disposed at a region surrounding the collector. The cleaning method of the lithography system comprises: shifting the droplet generator out of the light source generator via a port of the light source generator; inserting a shovel assembly into the light source generator via the port; using a borescope attached to the shovel assembly to identify a location of a deposit formed by droplets generated by the droplet generator; using the shovel assembly to remove and collect the deposit; and withdrawing the shovel assembly along with the borescope from the light source generator via the port.

In another aspect of the present disclosure, a lithography system is provided. The lithography system comprises a light source generator. The light source generator comprises a collector, a droplet generator, a droplet catcher, a vessel and a cleaning apparatus. The droplet generator is disposed at a side of the reflector, and configured to emit droplets across a reflective side of the collector. The droplet catcher is disposed at another side of the collector, and configured to catch at least a portion of the droplets emitted from the droplet generator. The vessel covers the reflective side of the collector. A light reflected by the collector passes through a central passage of the vessel. The cleaning apparatus is attached to a surface of the vessel facing the collector and adjacent to the droplet catcher. The cleaning apparatus is configured to remove a deposit formed by a portion of the droplets not being caught by the droplet catcher.

In yet another aspect of the present disclosure, a cleaning method of a lithography system is provided. The lithography system comprises a light source generator. The light source generator comprises a collector, a droplet generator, a droplet catcher and a cleaning apparatus. The droplet generator and the droplet catcher are facing each other, and are disposed in a region surrounding the collector. The cleaning apparatus is located adjacent to the droplet catcher. The cleaning method of the lithography system comprises driving an actuator in the cleaning apparatus to control a deposit remover in the cleaning apparatus for removing a deposit around the droplet catcher. The deposit is formed by a portion of droplets generated by the droplet generator.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A cleaning method of a lithography system, wherein the lithography system comprises a light source generator, the light source generator comprises a collector, a droplet generator and a droplet catcher, the droplet generator and the droplet catcher are facing each other and disposed at a region surrounding the collector, and the cleaning method of the lithography system comprises:

shifting the droplet generator out of the light source generator via a port of the light source generator;

inserting a shovel assembly into the light source generator via the port;

using a borescope attached to the shovel assembly to identify a location of a deposit formed by droplets generated by the droplet generator;

using the shovel assembly to remove and collect the deposit; and withdrawing the shovel assembly along with the borescope from the light source generator via the port.

2. The cleaning method of the lithography system according to claim 1, wherein the steps of shifting out the drop generator, inserting the shovel assembly, identifying the location of the deposit, removing the deposit and withdrawing the shovel assembly are performed without shifting the collector out of the light source generator.

3. The cleaning method of the lithography system according to claim 1, wherein the shovel assembly is operated manually.

4. The cleaning method of the lithography system according to claim 1, wherein the shovel assembly is operated by a robotic arm.

5. The cleaning method of the lithography system according to claim 1, wherein the shovel assembly comprises a handle bar and a shovel connected to the handle bar, and the shovel is configured to contact the deposit.

6. The cleaning method of the lithography system according to claim 5, wherein the shovel is coated with an adhesive material.

7. The cleaning method of the lithography system according to claim 5, wherein an edge portion of the shovel is covered by an elastic cover layer.

8. The cleaning method of the lithography system according to claim 5, wherein the shovel assembly further comprises a suction tube and a pump, the suction tube is attached to the handle bar, and the pump is configured to pump out the removed deposit through the suction tube.

9. The cleaning method of the lithography system according to claim 5, wherein the shovel assembly further comprises a heating device, the heating device is attached to the handle bar, and is configured to melt or soften the to-be-removed deposit.

10. The cleaning method of the lithography system according to claim 1, further comprising:

monitoring the removal of the deposit by using the borescope; and adjusting a movement of the shovel assembly according to an image shown by the borescope during the removal of the deposit.

11. The cleaning method of the lithography system according to claim 1, wherein the light source generator further has two additional ports through which the collector and the droplet catcher are installed and shifted out, respectively.

12. A cleaning method of a lithography system, comprising:

removing a droplet generator from a light source generator in the lithography system through a side port of the light source generator, such that a droplet catcher of the light source generator facing toward the side port is accessible through the side port;

inserting a shovel assembly and a borescope into a chamber of the light source generator via the side port, wherein the borescope is attached to the shovel assembly;

using the borescope to identify a location of a droplet deposit generated by the droplet generator and located in a vicinity of the droplet catcher, wherein movement of the borescope is realized by controlling the shovel assembly;

removing and collecting the droplet deposit by moving the shovel assembly; and withdrawing the shovel assembly and the borescope from the chamber via the side port.

13. The cleaning method of the lithography system according to claim 12, wherein the lithography system is an extreme ultraviolet (EUV) lithography system.

14. The cleaning method of the lithography system according to claim 12, wherein a material of the droplet deposit comprises tin.

15. The cleaning method of the lithography system according to claim 12, wherein the droplet deposit is knocked off and held by the shovel assembly.

16. The cleaning method of the lithography system according to claim 12, wherein the droplet deposit is knocked off and pumped out of the chamber by the shovel assembly.

17. The cleaning method of the lithography system according to claim 12, wherein the droplet deposit is further melted or softened by the shovel assembly before being removed.

18. The cleaning method of the lithography system according to claim 12, wherein the light source generator further comprises an ellipsoidal reflector located between the side port and the droplet catcher, and the ellipsoidal reflector stays in the chamber during cleaning of the lithography system.

19. A cleaning method of a lithography system, comprising:

removing a droplet generator from a light source generator of the lithography system through a side port of the light source generator while a main port of the light source generator remains sealed, and the main port is greater than the side port in terms of size; and removing and collecting droplet deposits around a droplet catcher of the light source generator by a shovel assembly inserted into a chamber of the light source generator via the side port while the main port is still sealed.

20. The cleaning method of the lithography system according to claim 19, wherein a borescope is further inserted into the chamber along with the shovel assembly, and is configured to obtain internal image of the chamber.

* * * * *